(12) United States Patent
Zhu et al.

(10) Patent No.: US 10,650,873 B2
(45) Date of Patent: May 12, 2020

(54) 3D PERPENDICULAR MAGNETIC CROSSBAR MEMORY

(71) Applicant: Carnegie Mellon University, Pittsburgh, PA (US)

(72) Inventors: Jian-Gang Zhu, Pittsburgh, PA (US); Chia-Ling Chien, Pittsburgh, PA (US); Qinli Ma, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 16/011,028

(22) Filed: Jun. 18, 2018

(65) Prior Publication Data

US 2018/0366173 A1 Dec. 20, 2018

Related U.S. Application Data

(60) Provisional application No. 62/603,939, filed on Jun. 16, 2017.

(51) Int. Cl.

| G11C 11/00 | (2006.01) |
|---|---|
| *G11C 11/16* | (2006.01) |
| *H01L 27/22* | (2006.01) |
| *H01L 43/02* | (2006.01) |
| *H01L 43/10* | (2006.01) |
| *H01L 43/08* | (2006.01) |

(52) U.S. Cl.
CPC ........ *G11C 11/161* (2013.01); *G11C 11/1673* (2013.01); *G11C 11/1675* (2013.01); *H01L 27/222* (2013.01); *H01L 43/02* (2013.01); *H01L 43/08* (2013.01); *H01L 43/10* (2013.01)

(58) Field of Classification Search
CPC .............. G11C 11/161; G11C 11/1673; G11C 11/1675; H01L 27/222; H01L 43/02; H01L 43/08; H01L 43/10
See application file for complete search history.

(56) References Cited

U.S. PATENT DOCUMENTS

| 8,952,470 B2* | 2/2015 | Lupino | ................. H01L 27/224 |
|---|---|---|---|
| | | | 257/421 |
| 9,337,419 B2* | 5/2016 | Kariyada | ................. H01L 43/08 |
| 9,825,217 B1* | 11/2017 | Kim | ...................... G11C 11/161 |
| 10,042,559 B2* | 8/2018 | Kim | ........................ G06F 3/061 |

\* cited by examiner

*Primary Examiner* — Pho M Luu
(74) *Attorney, Agent, or Firm* — Fish & Richardson P.C.

(57) ABSTRACT

A memory array that comprises three dimensionally stacked two-dimensional memory arrays. The memory array includes a first layer and a second layer oriented orthogonal to the first layer. The memory array further includes a magnetic tunnel junction adjacent to each of the first layer and the second layer. The magnetic tunnel junction further includes a first magnetic layer adjacent to the second layer. Additionally, the magnetic tunnel junction includes a second magnetic layer adjacent to the first layer. The magnetic tunnel junction also includes a tunnel layer adjacent to the first magnetic layer and the second magnetic layer.

24 Claims, 7 Drawing Sheets

3D PERPENDICULAR MAGNETIC CROSSBAR MEMORY

CROSS-REFERENCE TO RELATED APPLICATIONS

This application claims priority to U.S. Provisional Patent Application No. 62/603,939, filed on Jun. 16, 2017, which is hereby incorporated by reference in its entirety.

TECHNICAL FIELD

This specification generally relates to computer memory for computing and data storage. This device can be integrated monolithically on semiconductor integrated circuits or created as a stand-alone memory chip.

BACKGROUND

Memory includes computer hardware integrated circuits utilized to store information for immediate use on a computer. Computer memory can operate at high speeds as a distinction from storage that provides slow-to-access information but offers higher capacity storage.

SUMMARY

In general, one innovative aspect of the subject matter disclosed described in this specification includes a memory array that includes a first layer, a second layer oriented orthogonal to the first layer, and a magnetic tunnel junction adjacent stack connected to each of the first layer and the second layer. The magnetic tunnel junction stack comprises a first magnetic electrode adjacent to the second layer and a second magnetic electrode adjacent to the first layer; and a tunnel layer adjacent to the first magnetic layer and the second magnetic layer.

In some implementations, the memory array can include one or more of the following features. The first layer includes a plurality of film layers. The plurality of film layers includes at least a metal layer comprises sublayers of relatively heavy metal elements such as a tungsten (W) layer and/or a platinum (Pt) layer. The plurality of film layers includes a magnetic layer, such as cobalt (Co), or iron (Fe), or nickel (Ni), or their alloy form. The second layer includes a conductive metal layer. The conductive metal layer can be a copper layer, or a gold layer, or a platinum layer, or an aluminum layer. The magnetic tunnel junction stack placed in between the first and the second layers comprises the first magnetic layer, which includes iron, cobalt, iron-cobalt-boron alloy, nickel, the second magnetic layer which is a composite of a metal layer, which could be either iridium, or copper, or platinum, and a magnetic layer which includes iron, cobalt, iron-cobalt-boron alloy, nickel, and the tunnel barrier layer which includes Magnesium Oxide, aluminum oxide. The second layer oriented orthogonal to the first layer includes the second layer separated by a vertical distance of a height of the magnetic tunnel junction stack from the first layer and the second layer is rotated along a plane of 90 degrees with respect to the first layer. The electrodes of the magnetic tunnel junction stack adjacent to each of the first layer and the second layer further includes a first surface of the magnetic tunnel junction stack in contact with a surface of the first layer and a second surface of the magnetic tunnel junction stack in contact with a surface of the second layer.

In another aspect of the present disclosure, a method for programming a memory element in a memory array, the memory array includes a first layer with a plurality of columns, a second layer with a plurality of rows, and a magnetic tunnel junction adjacent to each of the first layer and the second layer at each cross-over between the rows and columns. The method includes applying a current with a first amplitude, a first polarity, and a first duration along a column in the first layer of the memory array while simultaneously applying a voltage with a second amplitude, a second polarity, and a second duration to a row in the second layer of the memory array to program the memory element. Applying a bias voltage to one or more other columns in the first layer of the memory array.

In some implementations, the method further includes inducing a magnetic torque that generates a first magnetization in a second magnetic layer in the magnetic tunnel junction adjacent stack to the first layer in the memory array while a second magnetization exists in a first magnetic layer in the magnetic tunnel junction adjacent to the second layer in the memory array.

In some implementations, applying the current further includes inducing the second magnetization in the first magnetic layer in the memory array.

In some implementations, applying the voltage further includes applying the bias voltage to one or more other rows in the second layer to ensure the one or more other memory elements in the memory array are not programmed.

In some implementations, the method further includes applying the bias voltage to one or more other rows in the second layer to ensure the one or more other memory elements in the memory array are not programmed.

In some implementations, the method further includes a direction of the second magnetization is antiparallel to a direction of the first magnetization.

In some implementations, the first magnetic layer includes a FeCoB/Tungsten/Ruthenium/(Cobalt/Platinum/Cobalt/Platinum).

In some implementations, the second magnetic layer includes FeCoB, Iridium, Cobalt.

In some implementations, the magnetic tunnel junction adjacent to each of the first layer and the second layer further includes a first surface of the magnetic tunnel junction in contact with a surface of the first layer and a second surface of the magnetic tunnel junction in contact with a surface of the second layer.

In another aspect of the present disclosure, a method for reading a memory element in a memory array, wherein the memory array comprises a first layer with a plurality of columns, a second layer with a plurality of rows, and a magnetic tunnel junction adjacent to each of the first layer and the second layer. The method includes applying a first voltage with a first amplitude, a first polarity, and a first duration to a column in the first layer in the memory array to read the memory element. Applying a second voltage to a row in the second layer in the memory array to read the memory element. Determining a resistance of the memory element that corresponds to the column in the first layer and the row in the second layer by identifying a current value in the column of the first layer.

In some implementations, the first layer includes a plurality of thin film layers.

In some implementations, the second layer comprises a conductive metal layer of multiple metal layers.

In another aspect of the present disclosure, a system includes a first layer to conduct voltage. A second layer to conduct current, wherein the second layer is rotated about a plane of 90 degrees with respect to the first layer. A reference layer with a first perpendicular magnetic anisotropy adjacent to a surface of the first layer, wherein the reference layer comprises an amorphous phase layer. A tunnel barrier adjacent to a surface of the reference layer. A free layer with a second perpendicular magnetic anisotropy adjacent to a surface of the tunnel barrier and a surface of the second layer.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
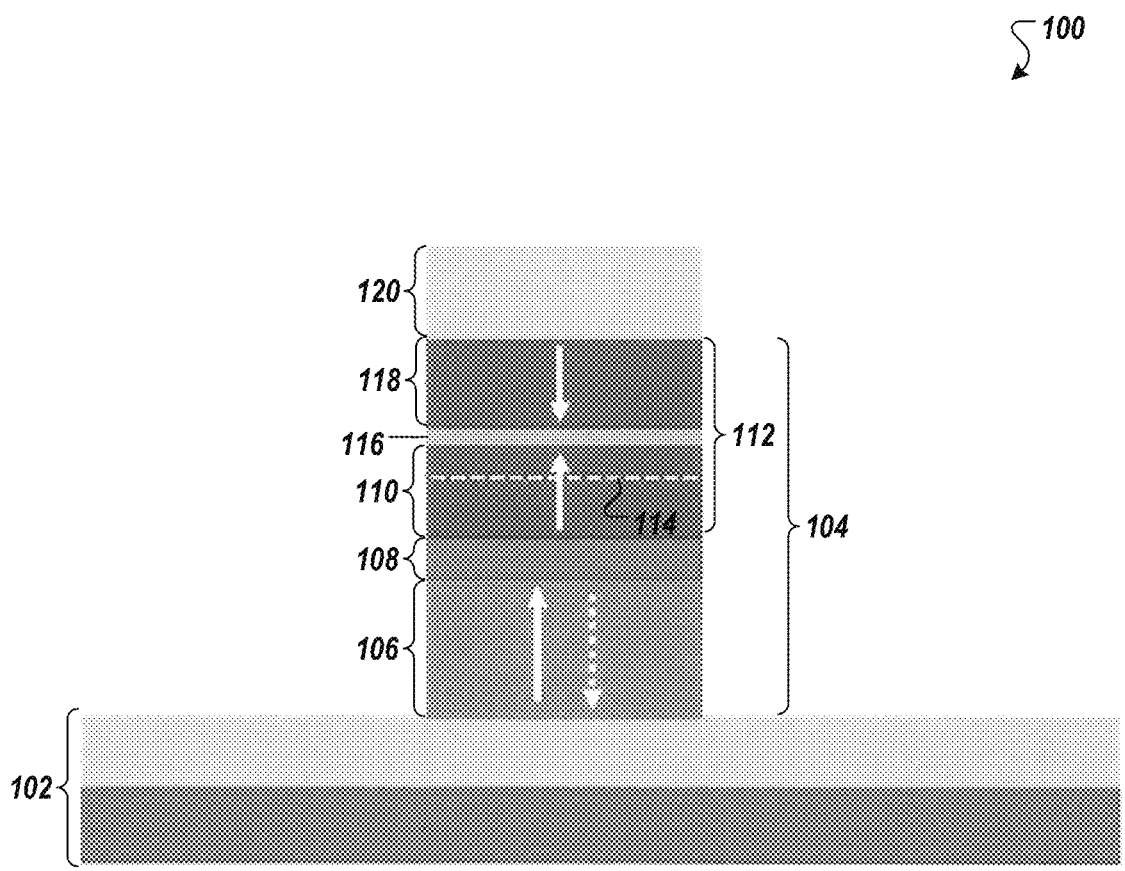
FIG. 1 illustrates an example system of a two-terminal magnetic tunnel junction based memory element.

FIG. 1 illustrates a cross section of a crossbar memory array 100. In some implementations, the crossbar memory array 100 is a two-dimensional memory array. In other implementations, the crossbar memory array is a three-dimensional memory array. The crossbar memory array includes a layer 102, a layer 120, and a junction or memory element 104. The layer 102 can be a wire or another conduit that carries current. The layer 120 can be a wire or another conduit that carries voltage. In some implementations, layers 102 and 120 can both carry voltage and current. In some implementations, the crossbar memory array 100 can be flipped upside-down, such that the layer 120 is on the bottom and layer 102 is on top. Similarly, when the layer 120 is on the bottom and the layer 102 is on top, the memory element 104 is also flipped upside-down. The memory element 104 can also be based on a magnetic tunnel junction.

In some implementations, memory element 104 is a two-terminal tunnel junction based memory element. The memory element 104 can be magnetic and can connect to the layer 120 and the layer 102. The memory element 104 includes a "reference electrode" or "reference layer" 112 and a "switching electrode", or "free layer" 106. In some implementations, the reference electrode 112 includes a fixed magnetization that does not reverse its orientation during a memory read or write operation. For example, the reference electrode 112 can include a magnetization that is oriented upwards or downwards and perpendicular to the layer 120 and the layer 102. The switching electrode 106 includes a switching magnetization that can change its orientation during a memory read or write operation. For example, the switching electrode 106 can initially have a magnetization that is oriented upwards and perpendicular to the layer 120 and the layer 102. Later, the switching electrode 106 can change its magnetization to downwards during a memory read or write operation. In some implementations, the magnetizations of the reference electrode 112 and the switching electrode 106 can be oriented in the same direction. In other implementations, the magnetizations of the reference electrode 112 and the switching electrode 106 can be oriented in opposing directions.

The layer 102 connects to the free layer 106 of the memory element 104. The layer 120 connects to the reference electrode 112 of the memory element 104. In some examples, the layer 102 carries current and the layer 120 carries voltage.

In some implementations, the current wire 102 is formed by stacking multiple thin film layers. The function of the stacked multiple thin film layers is such that a current flow in the layer 102 will yield an injection of spin current to the free layer 106 of the memory element 104 that is in contact with the layer 102. Due to the spin injection, the magnetization of the free layer 106 will experience a magnetic torque, effectively as if a magnetic field is applied to the magnetization of the free layer 106. The magnetic torque experience can be applied to each free layer, other than free layer 106 shown in FIG. 1, connected to layer 120 and layer 102.

Examples of the formation of the layer 102 include a tungsten (W)/platinum (Pt) bi-layer with tungsten layer having thickness around 2 nanometer and platinum having thickness around 3 nanometers. The tungsten is stacked on top of the platinum bi-layer. Another example includes a tantalum (Ta)/platinum (Pt) bi-layer. The tantalum is stacked on top of the platinum. In both stacking examples of the layer 102, the signs of spin Hall angle for the two metal layers (e.g., tungsten/platinum and tantalum/platinum) are opposite. Another example includes a magnetic layer and a layer of heavy metal element and the heavy metal element includes tantalum (Ta), tungsten (W), iridium (Ir), platinum (Pt). In some examples, the multilayer film stacks are fabricated using a magnetron sputtering technique.

Examples of the formation of the layer 102 include a magnetic layer having thickness around 2 nanometers. The magnetic materials of the magnetic layer includes cobalt (Co), iron (Fe), and nickel (Ni).

In some implementations, different layers within the multilayer stack of the layer 102 may have (but are not limited to) different materials with different spin Hall angles. Combinations of materials with different values of spin Hall angles and different signs can be chosen for optimization of magnetization that switches in the free layer 106 for both the in-plane spin component and the effective perpendicular-field component for switching the magnetization of the free layer 106. As a result, the switching of the magnetization of the free layer 106 switches the memory state of the memory element 104.

In some implementations, the layer 120 includes a conducting metal layer with either a single element metal or a composite of multiple metal layers. Examples of the metal layers include copper (Cu), gold (Au), platinum (Pt), aluminum (Al), or combinations or sub-combinations of the above.

The free layer 106 of the memory element 104 includes a magnetic metal with a perpendicular magnetic anisotropy often arising from the metal-tunnel barrier interface 108. When an electric field is applied to the memory element 104, a voltage around 1 volt or less is applied across the tunnel barrier layer 108. The voltage applied across the metal-tunnel barrier layer 108 can usually change the anisotropy of the free layer 106, which increases or decreases the strength of the free layer 106 depending on the polarity of the applied voltage (the direction of the electric field). For example, the polarity of the applied voltage can be positive or negative. In some implementations, MTJ-suited materials with enhanced effect of voltage controlled anisotropy strength can be used. In some implementations, a voltage around 1 volt or less (in the form of a pulse) can be applied to reduce the magnetic anisotropy of the free layer 106 to assist the reversal of magnetization orientation in the free layer 106 of a selected memory element.

In some implementations, the free layer 106 can include one or more stacked layers. For example, the one or more stacked layers can include iron-cobalt-boron alloy FeCoB/X/Y with X including iridium (Ir), tungsten (W), tantalum (Ta), and Y including CoFeB, Co=. I Other combinations of the free layer 106 can include different stacked orders of FeCoB and MgO. Another example of the free layer 106 can include FeCoB/X where X includes iridium (Ir), platinum (Pt), palladium (Pd), tungsten (W).

The reference electrode 112 of the magnetic tunnel junction based memory element 104 can include a multilayer structure. In some implementations, the composite reference electrode 112 can include sequentially, starting from the metal-tunnel barrier interface 108, a magnetic layer 110 of perpendicular anisotropy with a phase breaking layer 114 of the thickness around 1 nm or less in-between the magnetic layer 110, a metallic interlayer 116, and a magnetic layer 118 (or a magnetic layer of super lattice) with perpendicular anisotropy. In some implementations, the reference electrode 112 can be created with a synthetic antiferromagnetic trilayer structure. Additionally, the reference electrode 112 can be adjacent to the metallic capping layer or the layer 120. The phase breaking layer 114 inserted in the magnetic layer 110 next to the metal-tunnel barrier interface 108 is often a thin amorphous layer with relatively high crystallization temperature. In other implementations, the multilayer structure of the reference electrode 112 can include other various formations.

In some implementations, the reference electrode 112 can include one or more stacked layers of synthetic antiferromagnetic trilayer material. In some implementations, the reference electrode 112 can include Magnesium Oxide (MgO), FeCoB, Tungsten (W), Ruthenium (Ru), (Cobalt/Platinum) repeated multilayer, IrMn, and Platinum material with tungsten. The reference electrode 112 can be stacked in the following manner starting from the tunnel barrier layer 108: MgO/FeCoB/W/FeCoB/Ru/(Cobalt/Platinum/Co) material with W (tungsten) as the insetting amorphous layer 114 and Cobalt/Platinum super lattice layer stacked for high perpendicular anisotropy. In other implementations, the reference electrode 112 can be stacked in other formations. The two magnetic layers (e.g., FeCoB and Cobalt/Platinum) adjacent to the Ruthenium layer are antiparallel coupled through the interlayer antiparallel exchange coupling.

As previously mentioned, the cross section of the crossbar memory array 100 can be made in reverse with layer 120 on the bottom and layer 102 on top. The structure of the memory element 104 would also be flipped in the vertical direction. In this example, the free layer 106 is in contact with the current wire 102 and the reference electrode 112 is connected to the layer 120.

As illustrated in FIG. 1, the cross section of the crossbar memory array 100 includes a layer 102. The cross section of the crossbar memory array 100 can be viewed in an orthogonal X-Y-Z plane. In some implementations, the layer 102 travels along an X direction in the orthogonal X-Y-Z plane. In other implementations, the layer 102 travels along a Y direction in the orthogonal X-Y-Z plane. The cross section of the crossbar memory array 100 also includes a voltage wire 120. In some implementations, the layer 120 travels along a Y direction in the orthogonal X-Y-Z plane in relation to the direction of travel of the layer 102. For example, if the layer 102 travels along the X direction in the X-Y-Z plane then the layer 120 travels along the Y direction in the X-Y-Z plane. Likewise, if the layer 102 travels along the Y direction in the X-Y-Z plane then the layer 120 travels along the X direction in the X-Y-Z plane. Thus, the layer 102 and the layer 120 are perpendicular or orthogonal with respect to one another.

The cross section of the crossbar memory array 100 includes a junction or memory element 104. The junction 104 can be a magnetic tunnel junction, for example. The junction 104 can include two magnetic electrodes—a reference layer 112 and a free layer 106. The free layer 106 and the reference layer 112 of the junction 104 each include a magnetic anisotropy. The magnetic anisotropy indicates a direction dependence of a material's magnetic properties, such as upwards or downwards, to name a few examples. Thus, the magnetic anisotropy of the free layer 106 and the reference layer 112 can be perpendicular or parallel to the current wire 102.

In some implementations, the junction 104 includes a metal-tunnel barrier interface 108. The metal-tunnel barrier interface 108 is adjacent to the free layer 106 and to the reference layer 112. The tunnel barrier layer 108 includes a thin insulating layer of electrical potential between two electrically conduction materials.

In some implementations, the junction 104 includes the reference layer 112. The reference layer 112 is adjacent to the metal-tunnel barrier interface 108 and the layer 120. The junction 104 is further stacked with a synthetic antiferromagnetic trilayer structure, as previously mentioned. The reference layer 112 includes the layer 110, which can be either magnetic or non-magnetic.

In some implementations, an amorphous phase breaking layer 114 can be included within the layer 112. The amorphous phase breaking layer 114 can be of a thin layer, such as 0.5 nm to 1.5 nm. In some implementations, an interlayer 116 can be included within the reference layer 112 and it provides antiparallel exchange coupling for the magnetic moments of the two adjacent magnetic layers. In some examples, the interlayer 116 can be metallic or non-metallic.

The reference layer 112 further includes a layer 118. In some examples, the layer 118 can be magnetic or non-magnetic. In one example, the layer 118 can be a multilayer of repeated cobalt and platinum bi-layer. The layer 118 exhibits perpendicular anisotropy. The layer 118 can also provide magnetic flux to compensate the magnetic flux from the layer 110. As previously mentioned, the layer 120 can travel along the Y direction in the X-Y-Z plane, while the layer 102 travels along the X direction in the X-Y-Z plane. In the alternative, the layer 120 travels along the X direction in the X-Y-Z plane, while the layer 102 travels along the Y direction in the X-Y-Z plane. Thus, the layer 102 and the layer 120 are perpendicular or orthogonal to one another.

Figure 2:
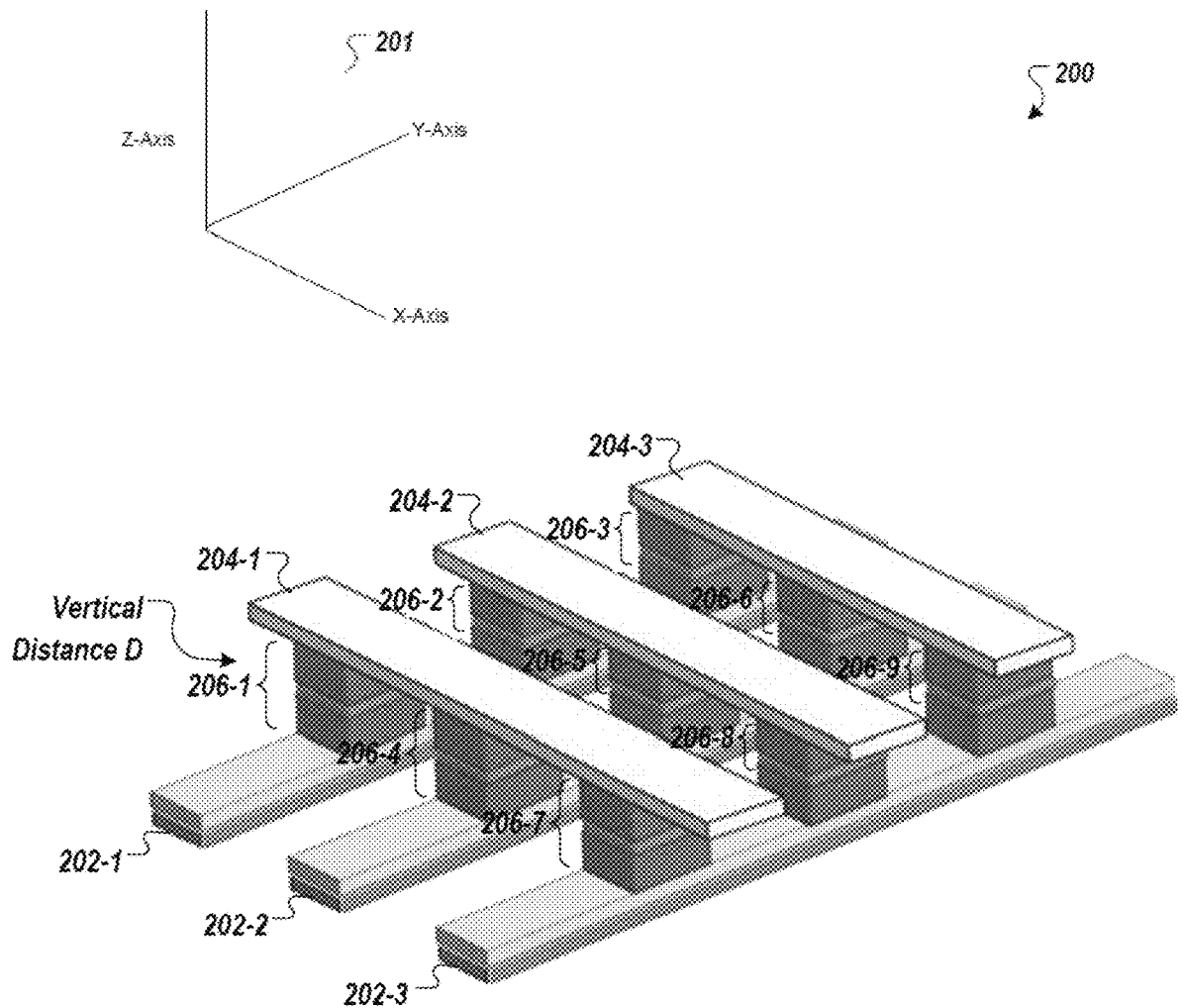
FIG. 2 illustrates an example of a crossbar memory array.

FIG. 2 illustrates an example of a crossbar memory array 200. In some implementations, the crossbar memory array 200 can be a three-dimensional crossbar memory array. In other implementations, the crossbar memory array 200 can be a two-dimensional crossbar memory array. FIG. 2 also illustrates an X-Y-Z dimensional axis 201 for reference when describing the crossbar memory array 200 below.

As illustrated in the crossbar memory array 200, the voltage wires 204-1 through 204-3 are arranged substantially in parallel with minimal electrical separation on a horizontal plane. For example, the three voltage wires 204-1 through 204-3 are arranged substantially in parallel along the X direction in the X-Y-Z plane 201. The minimal electrical separation between the voltage wires 204-1 through 204-3 can include a range between 3-4 nanometers (nm). The current wires 202-1 through 202-3 are also arranged substantially in parallel with minimal electrical separation on another horizontal plane. For example, the three current wires 202-1 through 202-3 are arranged substantially in parallel along the Y direction in the X-Y-Z plane 201. The minimal electrical separation between the current wires 202-1 through 202-3 can also include a range between 3-4 nm. Thus, the three current wires are oriented orthogonally or approximately orthogonal with respect to the orientation of the voltage wires 204-1 through 204-3.

The voltage wires 204-1 through 204-3 and current wires 202-1 through 202-3 can be separated by a vertical distance D along the Z direction in the X-Y-Z plane 201. The vertical distance D can be equivalent to the height of the memory element 206-1. For example, the height of the memory element 206-1 can include a height range between 3-10 nm. Memory elements 206-1 through 206-9 are connected to voltage wires 204-1 through 204-3 and current wires 202-1 through 202-3 at each crossing between the voltage and current wires.

As shown in FIG. 2, the crossbar memory array 200 is formed with a planar array of parallel current wires orthogonally, or approximately orthogonally oriented with respect to another planar array of parallel voltage wires. The plane of the current wire array and the plane of the voltage wire array are vertically separated by the height of a memory element. For example, the crossbar memory array 200 illustrates three current wires—current wire 202-1, current wire 202-2, and current wire 202-3. The number of current wires can be more or less than three, while three current wires are shown for illustrative purposes only. A memory element that is placed at a crossing with its reference electrode connected to the voltage wire and the free layer connected to the current wire. For example, crossbar memory array 200 illustrates memory elements 206-1 through 206-9. The memory elements 206-1, 206-2, and 206-3 are in contact with current wire 202-1 and voltage wires 204-1, 204-2, and 204-3. Similarly, memory elements 206-4, 204-5, and 206-6 are in contact with current wire 202-2 and voltage wires 204-1, 204-2, and 204-3. Similarly, memory elements 206-7, 206-8, and 206-9 are in contact with current wire 202-3 and voltage wires 204-1, 204-2, and 204-3. As illustrated below, other implementations include multiple crossbar memory arrays stacked on top of one another or stacked side-by-side.

Figure 3:
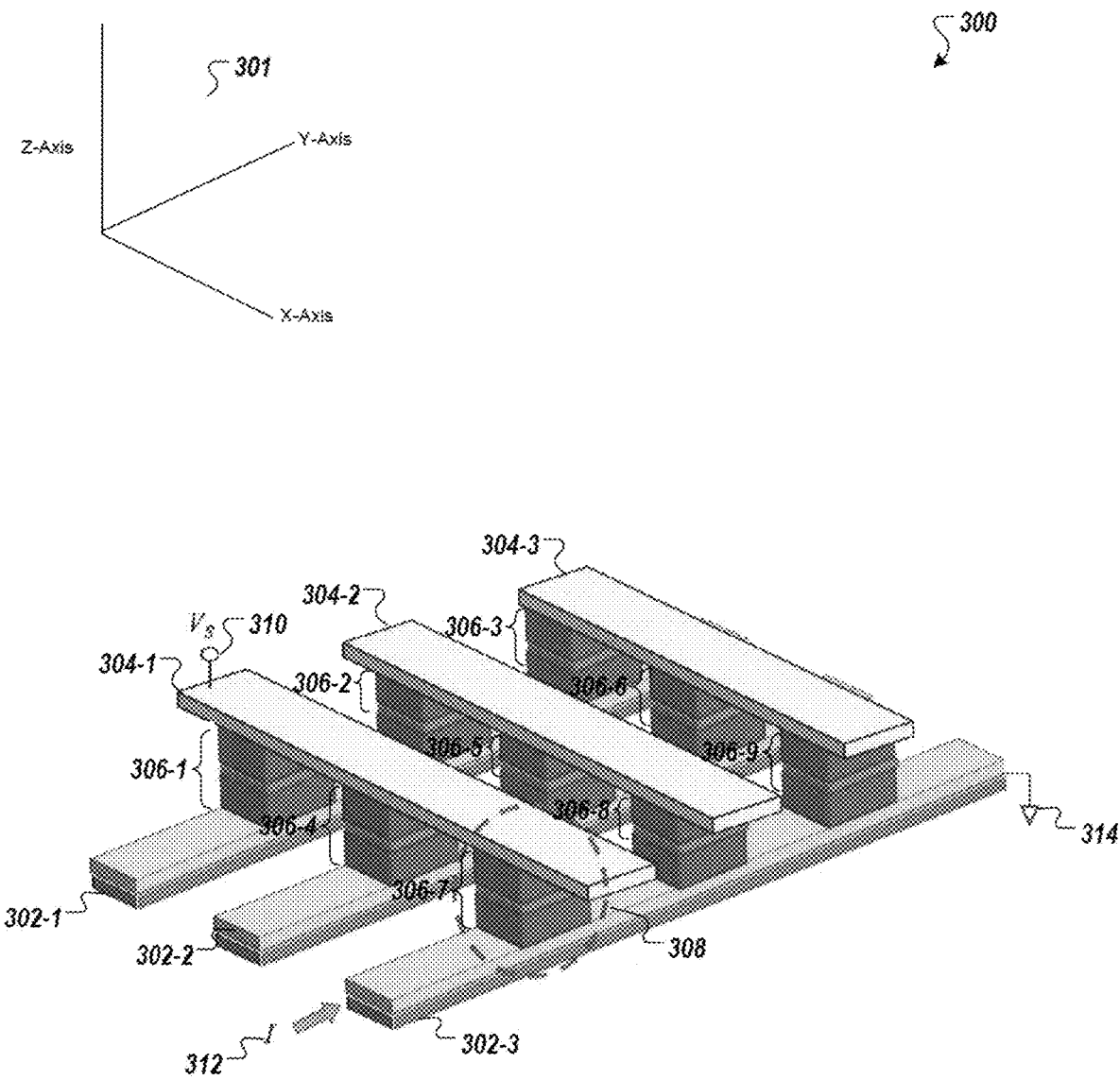
FIG. 3 illustrates another example of a crossbar memory array.

FIG. 3 illustrates another example of a crossbar memory array 300. FIG. 3 also illustrates how an individual memory element 308 in the crossbar memory array 300 can be programmed. Similar to crossbar memory array 200, crossbar memory array 300 includes current wires 302-1 through 302-3, voltage wires 304-1 through 304-3, and memory elements 306-1 through 306-9.

In some implementations, a voltage is applied to a voltage wire on the crossbar memory array 300. In particular, a voltage 310 is applied to voltage wire 304-1 of the crossbar memory array 300 for a particular duration. The voltage 310 applied can include a certain polarity and a certain amplitude. For example, the applied voltage 310 can be a positive voltage and can include a voltage amplitude range from 2.5 to 5 volts and applied for 4 seconds. The voltage wire 304-1 connects to the memory element 308. At a simultaneous or substantially simultaneous time, a current with certain polarity and amplitude is applied to the current wire connected to the same memory element 308 for a particular duration. For example, a current 312 is applied to the current wire 302-3 that is connected to the same memory element 308 for 4 seconds. The combined effect of the voltage 310 applied to voltage wire 304-1 and the current 312 applied to current wire 302-3 is designed to provide a magnetization effect to the memory element 308. In particular, the magnetization effect on the memory element 308 orients the magnetization of the free layer of the memory element 308 to the desired direction, such as upwards or downwards, along the axis perpendicular to the current layer 302-3.

As shown in FIG. 3, for write addressing, or programming, of any selected individual memory element, such as memory element 308, in a two-dimensional crossbar array, a voltage 302 with certain amplitude and polarity is applied to the voltage wire 204-1 for a particular duration to which the reference electrode of the selected element 308 is connected. For example, a voltage 310 can be a positive voltage with an amplitude range between 0.5 to 2 volts applied for 0.5 nanoseconds. Simultaneously or substantially simultaneously, a current 312 of a certain magnitude and polarity is applied in the current wire 302-3 to which the free layer of the selected element 308 is connected. For example, a positive current 312 can be applied with 50 microamp μA amplitude for 0.5 nanoseconds. The applied voltage across the metal-tunnel barrier interface 108 of the selected element 308 is designed to reduce the perpendicular anisotropy of the free layer of the selected memory element 308 while the spin injection to the free layer of the selected memory element 308 arising from the current flow in the current wire 302-3 causes a magnetic torque on the free layer magnetization. The combined effect forces the magnetization of the free layer of the selected memory element 308 to orient either upwards or downwards along the perpendicular direction depending on the current direction in the current wire 302-3. Ground 306 is also included along the selected current wire 302-3.

In some implementations, each memory element of the crossbar memory array 300 can include one or more stacked materials. For example, the materials can include FeCoB, MgO, W, and others. In one example, the memory element, such as memory element 306-1, is stacked with these elements in the following manner starting below the voltage wire 304-1: FeCoB/MgO/FeCoB. In other implementations, the memory element 306-1 can be stacked starting below the voltage wire 304-1 in the following manner: MgO/FeCoB.

In some implementations, tunnel barrier of the memory element, such as metal-tunnel barrier interface 108 of the memory element 104, has sufficient thickness for sufficiently high breakdown voltage, sufficiently high electric resistance, and sufficiently high tunneling magnetoresistance ratio (TMR). For example, sufficient thickness for sufficiently high breakdown voltage, sufficiently high electric resistance, and sufficiently high tunneling magnetoresistance ratio can include 1 to 2 nanometers.

In some implementations, during a write addressing function (e.g., the programing of a selected memory element, such as selected memory element 308), the voltage drop along the selected current wire 302-3 should be negligibly small due to the relatively high conductance, or low resistance, of the wire. For example, the voltage drop along the selected current wire 302-3 can range from 0.5 volts to 2 volt. The tunneling current through the tunnel barrier interface 108 is also negligibly small due to the relatively high resistance of the metal-tunnel barrier interface 108. For example, the tunneling current can be around 0.1 μA (a tenth of microamps). The combined effect of this write-addressing scheme eliminates the possibility of sneak path effect. In particular, sneak path effect can be defined as an effect resulting from an unexpected path along which current, energy, or a logical sequence flows in an unintended direction. For this example, by having a low voltage drop along the selected current wire, a small tunneling current through the metal-tunnel barrier interface 108, current will flow through the metal-tunnel barrier interface 108 without leaking out of the free layer 106 or the reference layer 114, thus eliminating the sneak path effect.

In some implementations, a memory array size can include a varying number of memory elements connected to a voltage wire and a current wire. For example, a memory array size can include 1024 memory elements. Another example, a memory array size can include over 1 million memory elements. For a selected voltage wire, such as voltage wire 302-3, the memory elements other than the memory element targeted to be programmed can be referred to as half-select memory elements. The half-select memory elements are memory elements that do not change their magnetization, and as such, keep their memory state the same. For example, as illustrated in FIG. 3, memory element 308 is considered to be the memory element targeted to be programmed and memory elements 306-8 and 306-9 are referred to as the half-select memory elements. In some implementations the voltage amplitude applied during programing can be large enough to yield designed anisotropy reduction of the free layer of the selected memory element 308 and at the same time small enough to not to cause erroneous magnetization reversal of the half-selected elements. For example, the voltage amplitude should be 0.2 volts to 2 volts to change the memory state of the memory element 308 and keep the memory state of the half-selected memory elements (e.g., memory elements 306-8 and 306-9) the same.

To prevent erroneous state switching of the half-selected elements, such as elements 306-1 and 306-4, on the selected voltage wire 304-1, the electric potential of the other current wires, such as current wires 302-1 and 302-2 (except the selected current wire, such as current wire 302-3) can be offset with a bias voltage. For example, the bias voltage can be 0.5 volts. The bias voltage or the offset voltage is utilized to reduce the voltage drop across the memory element of the half-selected memory elements, such as memory elements 306-1 and 306-4, on the selected voltage-rail, such as voltage wire 304-1. As such, the current-rails connected to the half-selected elements, such as current wires 302-1 and 302-2, can electrically "float" to prevent erroneous state switching of the half-selected elements by offsetting these current rails with the bias voltage.

The scheme described above can also be applied during read addressing of an individual memory element in the array. In one instance, during a read address, the resistance of a selected memory element, such as memory element 308, is measured by applying a small voltage between the voltage wire and the current wire that are connected to the selected memory element and measuring the current flow through the current wire. For example, the resistance of memory element 308 is measured by applying a positive voltage of one volt to the current wire 302-3 and a positive voltage of two volts to the voltage wire 304-1, thus creating a voltage drop of one volt across the selected memory element 308, for a duration of three seconds. At the same time, the other unselected voltage wires and unselected currents wires are kept at the same electric potential as the selected current wire. For example, a voltage of one volt is applied to the voltage wires 304-2 and 304-3 and a voltage of one volt is applied to the current wires 302-1 and 302-2 to keep electric potential across each of the other memory elements the same. At the same time, the memory states of the other memory elements connected to the selected voltage wire can be determined by measuring the current flow through the corresponding current wires. For example, the memory states of the memory elements 306-1 and 306-4 can be measured by measuring the current flow through the current wires 302-1 and 302-2, respectively.

Figure 4:
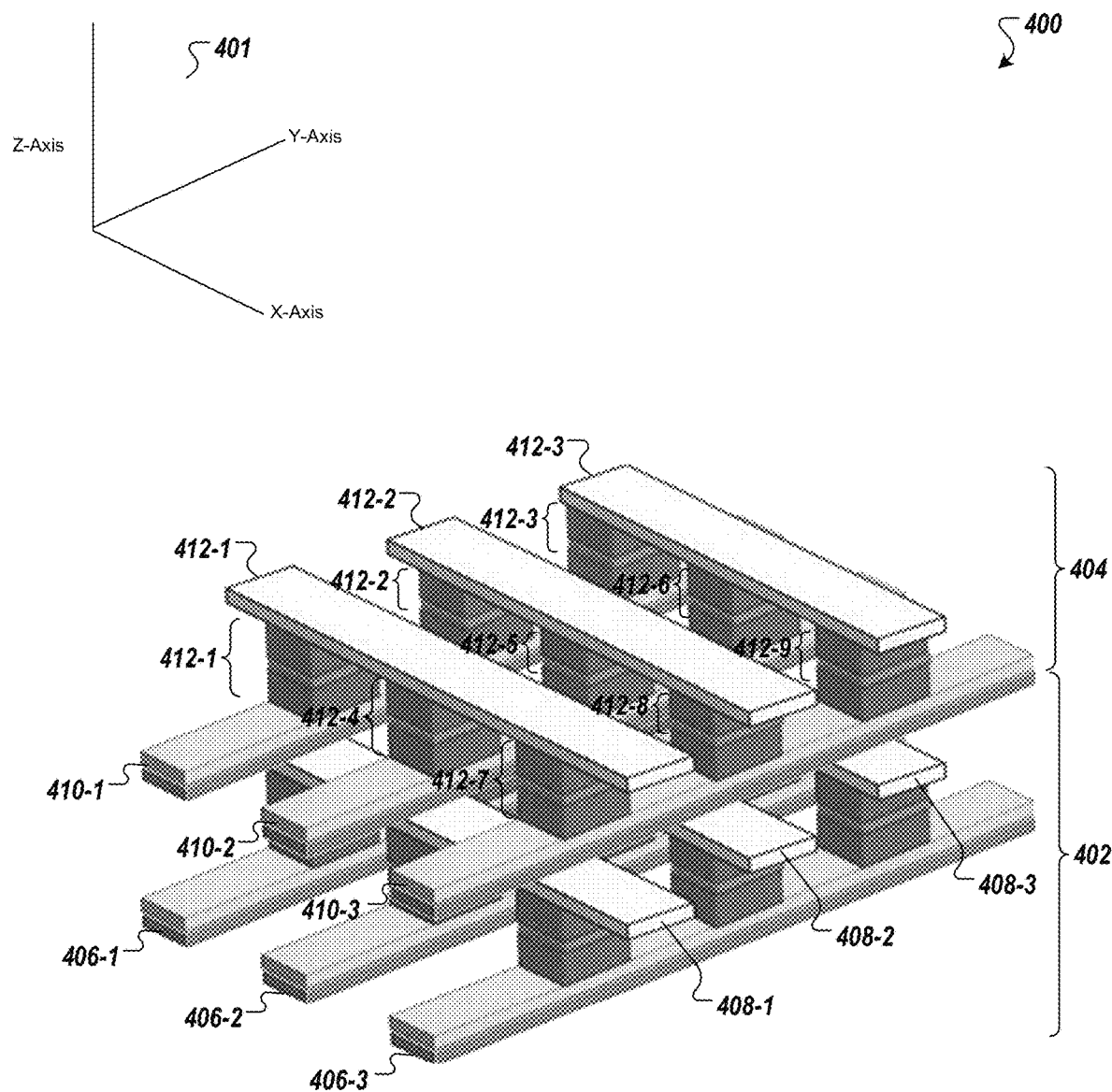
FIG. 4 illustrates an example of a multi-stacked crossbar memory array.

FIG. 4 illustrates an example of a multi-stacked crossbar memory array 400. The multi-stacked crossbar memory array 400 includes a first crossbar memory array 402 and a second crossbar memory array 404. In some implementations, the multi-stacked crossbar memory array 400 can be stacked vertically, as illustrated in FIG. 4. In other implementations, the multi-stacked crossbar memory array 400 can be stacked side-by-side. In other implementations, the multi-stacked crossbar memory array 400 can be stacked vertically and side-by-side. When the multi-stacked crossbar memory array 400 includes vertical or side-by-side various memory arrays, these multi-stacked crossbar memory arrays can share a set of conductive wires, such as voltage wires or current wires. The multi-stacked crossbar memory array 400 includes an additional two-dimensional crossbar magnetic memory array, such as second crossbar memory array 404, stacked vertically on top of the first crossbar memory array 404. The first crossbar memory array 402 includes current wires 406-1, 406-3, and 406-3; voltage wires 408-1, 408-2, and 408-3. The second crossbar memory array 404 includes current wires 410-1, 410-2, and 410-3; voltage wires 412-1, 412-2, and 412-3; and memory elements 412-1 through 412-9 between the current wires 410-1 through 410-3 and voltage wires 412-1 and 412-N. In addition, the first crossbar memory array 402 includes nine memory elements between the current wires 406-1 through 406-3 and voltage wires 408-1 through 408-3.

Figure 5:
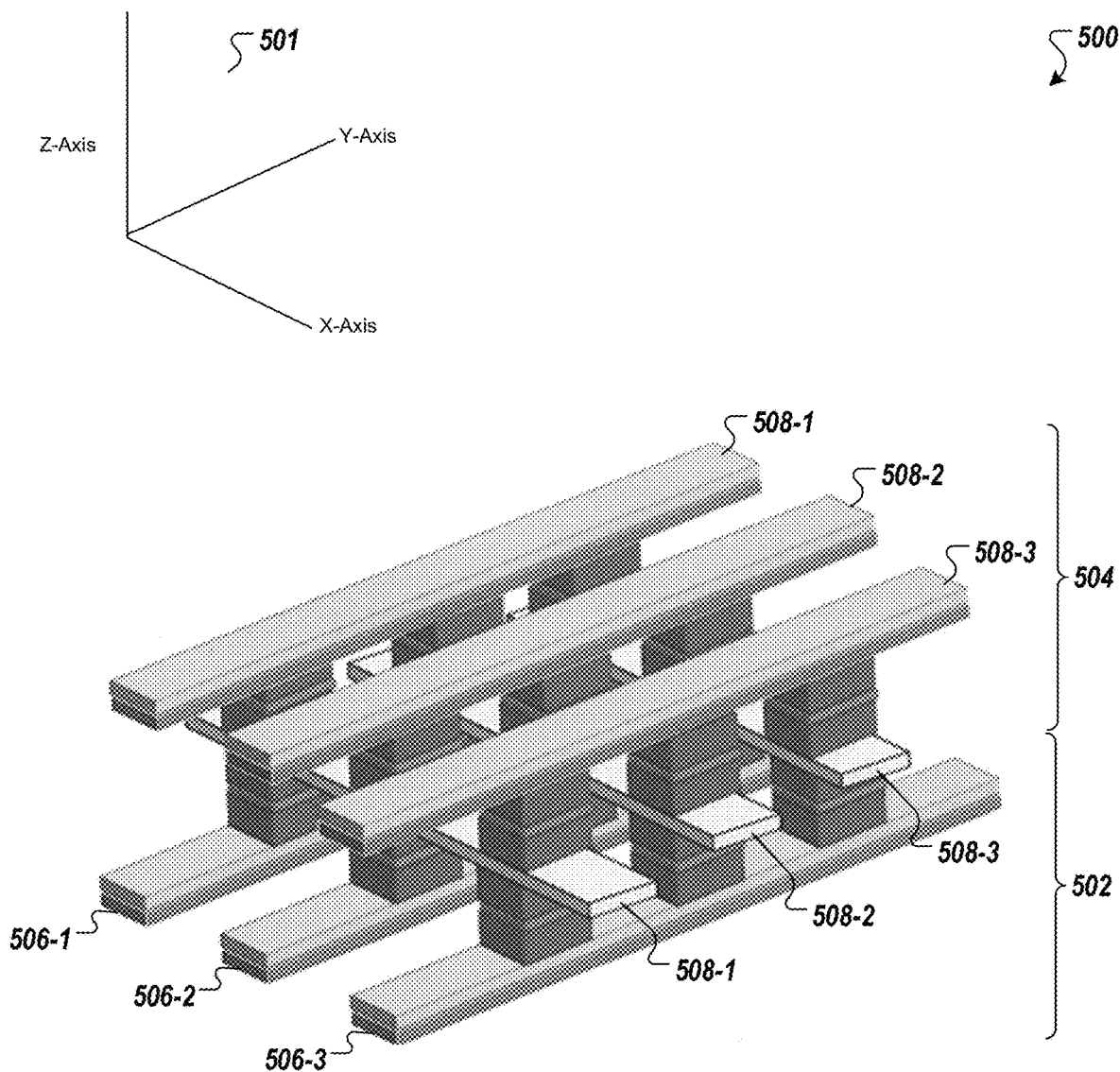
FIG. 5 illustrates another example of a multi-stacked crossbar memory array.

FIG. 5 illustrates another example of a multi-stacked crossbar memory array 500. The multi-stacked crossbar memory array 500 illustrates a first crossbar memory array 502 and a second crossbar memory array 504 that share a set of voltage wires. For example, the multi-stacked crossbar memory array 500 includes current wires 506-1 through 506-3 and current wires 508-1 through 506-3. Additionally, the multi-stacked crossbar memory array 500 includes a shared set of voltage wires 508-1 through 508-3. In other implementations, the system may share a set of current wires, depending on how the first crossbar memory array 502 and the second crossbar memory array 504 and other crossbar memory arrays are vertically stacked.

Figure 6:
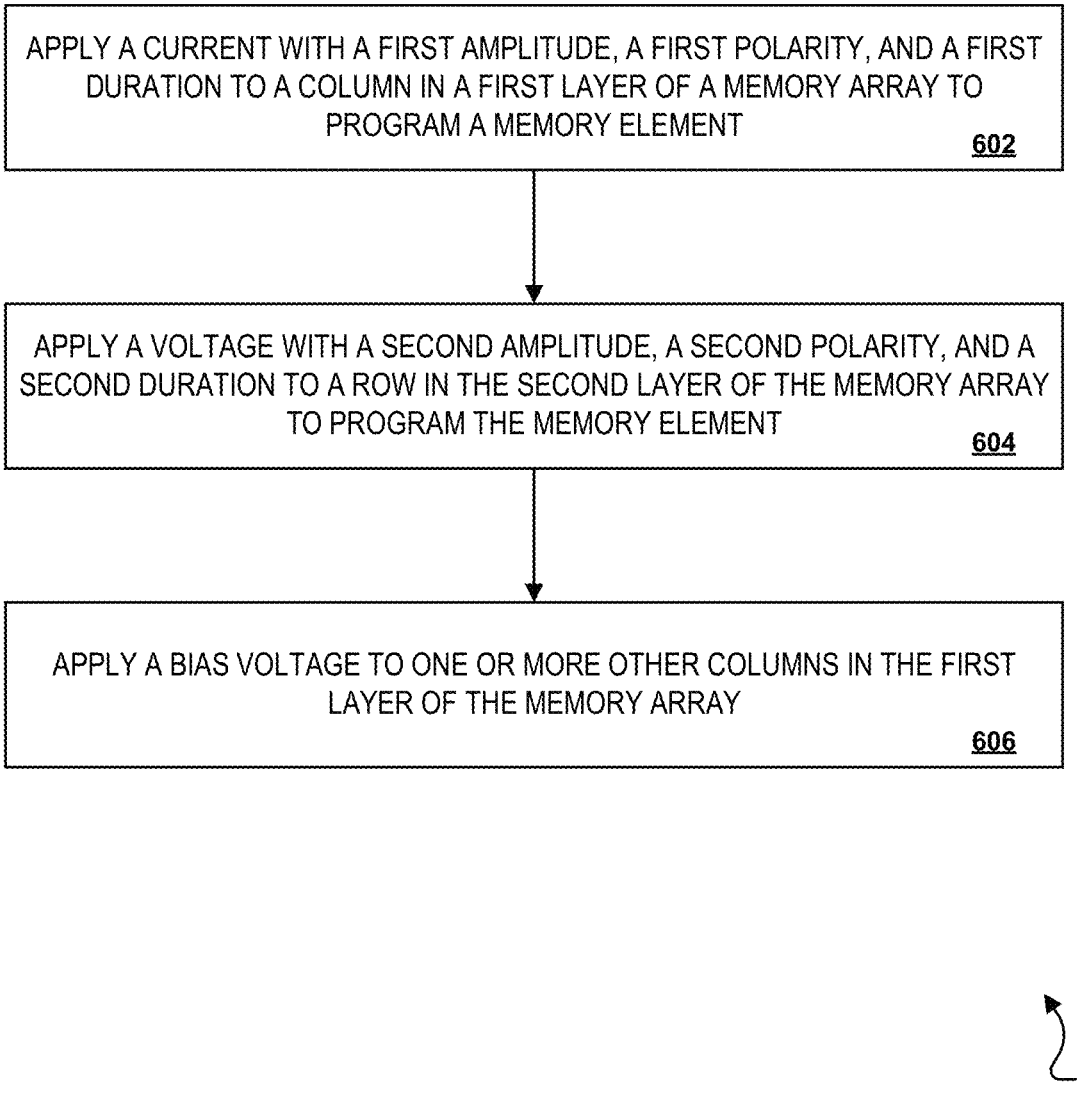
FIG. 6 illustrates a flowchart for programming a memory element in a memory array.

FIG. 6 illustrates a flowchart 600 for programming a memory element in a memory array. For clarity of presentation, the description that follows generally describes method 600 in the context of the other figures in this description. In some implementations, various steps of method 600 can be run in parallel, in combination, in loops, or in any order. For example, referring back to FIG. 3, memory array 300 includes a first layer with a plurality of columns, such as current wires 302-1 through 302-3, a second layer with a plurality of rows, such as voltage wires 304-1 through 304-3, and a magnetic tunnel junction based memory element adjacent to each of the first layer and the second layer, such as memory elements 306-1 through 306-9.

Now, referring back to FIG. 6, at 602, a current is applied with a first amplitude, a first polarity, and a first duration to a column in a first layer of a memory array to program a memory array. For example, referring back to FIG. 3, a positive current, such as current 312, with an amplitude of 1 ampere (A) is applied to a current wire 302-3 (i.e., a column in the first layer) for 3 seconds.

At 604, a voltage is applied with a second amplitude, a second polarity, and a second duration to a row in the second layer of the memory array to program the memory element. For example, referring back to FIG. 3, a positive voltage, such as voltage 310, with an amplitude of 2.5 to 5 volts is applied to a voltage wire 304-1 (e.g., a row in the second layer) for three seconds. The combined effect of applying the current 312 to current wire 302-3 and applying the voltage 310 to voltage wire 304-1 induces a voltage across the tunnel barrier of the selected memory element 308 to reduce the perpendicular anisotropy of the memory element 308's free layer while the spin injection of the free layer arises from the current flow 312 in the current wire 302-3 causing a magnetic torque on the free layer's magnetization. As a result, the magnetization of the free layer of the memory element 308 orients either upwards or downwards along the perpendicular direction depending on the direction of the current 312 in the current wire 302-3.

At 606, a bias voltage is applied to one or more other columns in the first layer of the memory array. For example, referring back to FIG. 3, a bias voltage is applied to the other current wires 302-1 and 302-2 to prevent erroneous state switching of the half-selected elements on the selected voltage wire 304-1. In this instance, the half-selected elements on the selected voltage wire 304-1 include memory elements 306-1 and 306-4. For example, a bias voltage can be in the range of 0.5 to 1.5 volts.

Figure 7:
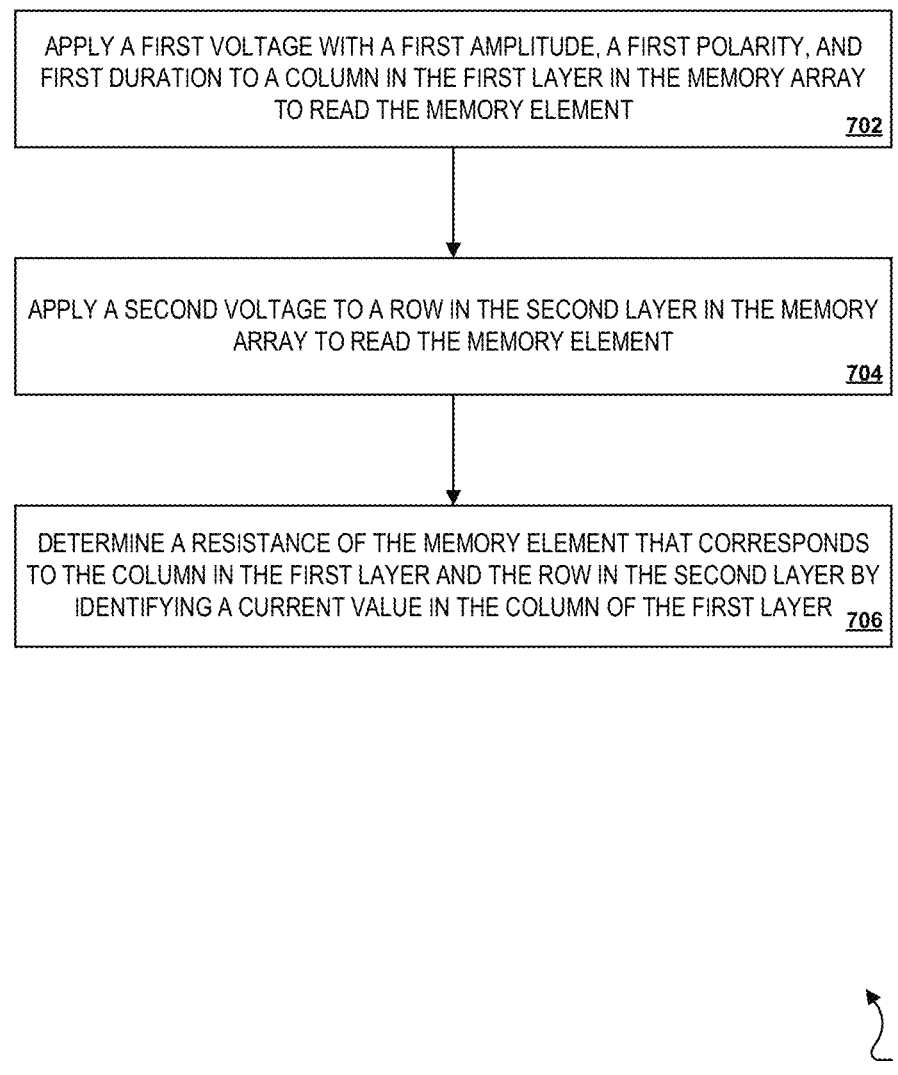
FIG. 7 illustrates a flowchart for reading a memory element in a memory array.

FIG. 7 illustrates a flowchart 700 for reading a memory element in a memory array. For clarity of presentation, the description that follows generally describes method 700 in the context of the other figures in this description. In some implementations, various steps of method 700 can be run in parallel, in combination, in loops, or in any order. For example, referring back to FIG. 3, the memory array, such as memory array 300, includes a first layer with a plurality of columns, such as current wires 302-1 through 302-3, a second layer with a plurality of rows, such as voltage wires 304-1 through 304-3, and a magnetic tunnel junction based memory element adjacent to each of the first layer and the second layer, such as memory elements 306-1 through 306-9.

Now, referring back to FIG. 7, at 702, a first voltage is applied with a first amplitude, a first polarity, and a first duration to a column in the first layer in the memory array to read the memory element. For example, referring back to FIG. 3, a positive voltage of one volt is applied to a current wire 302-3 for three seconds in a memory array 300 to read the storage of memory element 308.

At 704, a second voltage is applied to a row in the second layer in the memory array to read the memory element. For example, referring back to FIG. 3, a positive voltage of two volts is applied to a voltage wire 304-1 for three seconds in the memory array 300 to read the storage of memory element 308.

At 706, a resistance of the memory element is determined that corresponds to the column in the first layer and the row in the second layer by identifying a current value in the column of the first layer. Continuing with the example and referring back to FIG. 3, a voltage drop of one volt is created across the selected memory element 308 for a duration of three seconds. During that three second duration, the other unselected voltage wires and unselected current wires are kept at the same electric potential as the selected current wire. For example, a voltage of one volt is applied to the voltage wires 304-2 and 304-3 and a voltage of one volt is applied to the current wires 302-1 and 302-2 to keep electric potential across each of the other memory elements the same. At the same time, the memory states of the other memory elements connected to the selected voltage wire can be determined by measuring the current flow through the corresponding current wires. For example, the memory states of the memory elements 306-1 and 306-4 can be measured by measuring the current flow through the current wires 302-1 and 302-2, respectively. Once the current flow is measured across the current wire 302-3, the resistance of the selected memory element 308 can be determined. For example, when the voltage drop across the selected memory element 308 is one volt and the current measured across the current wire 302-3 is found to be 1 microAmpere (mA), the resistance can be determined to be 1,000,000 ohms.

While this detailed description has disclosed certain specific embodiments for illustrative purposes, various modifications will be apparent to those skilled in the art which do not constitute departures from the spirit and scope of the invention as defined in the following claims, and it is to be distinctly understood that the foregoing descriptive matter is to be interpreted merely as illustrative of the invention and not as a limitation.

What is claimed is:

1. A memory array, comprising:
   a first layer;
   a second layer oriented orthogonal to the first layer; and
   a magnetic tunnel junction adjacent to each of the first layer and the second layer, the magnetic tunnel junction comprising:
   a first magnetic layer in contact with the second layer;
   a second magnetic layer in contact with the first layer; and
   a tunnel barrier layer adjacent to the first magnetic layer and the second magnetic layer.

2. The memory array of claim 1, wherein the first layer comprises a plurality of film layers.

3. The memory array of claim 2, wherein the plurality of film layer, comprises a magnetic layer.

4. The memory array of claim 2, wherein the plurality of film layers comprises at least a tungsten layer and a platinum layer.

5. The memory array of claim 4, wherein the conductive metal layer comprises at least a copper layer, a gold layer, a platinum layer, and an aluminum layer.

6. The memory array of claim 1, wherein the second layer comprises a conductive metal layer.

7. The memory array of claim 1, wherein the first magnetic layer comprises aFeCoB/Tungsten/FeCoB/Ruthenium/(Cobalt/Platinum/Cobalt).

8. The memory array of claim 1, wherein the second magnetic layer comprises FeCoB, Iridium, and FeCoB.

9. The memory array of claim 1, wherein the second layer oriented orthogonal to the first layer further comprises the second layer separated by a vertical distance of a height of the magnetic tunnel junction from the first layer and the second layer is rotated along a plane of 90 degrees with respect to the first layer.

10. The memory array of claim 1, wherein the magnetic tunnel junction adjacent to each of the first layer and the second layer further comprises a first surface of the magnetic tunnel junction in contact with a surface of the first layer and a second surface of the magnetic tunnel junction in contact with a surface of the second layer.

11. A method for programming a memory element in a memory array, wherein the memory array comprises a first layer with a plurality of columns, a second layer with a plurality of rows, and a magnetic tunnel junction adjacent to each of the first layer and the second layer, the method comprising:

applying a current with a first amplitude, a first polarity, and a first duration to a column in the first layer of the memory array to program the memory element;

applying a voltage with a second amplitude, a second polarity, and a second duration to a row in the second layer of the memory array to program the memory element; and applying a bias voltage to one or more other columns in the first layer of the memory array.

12. The method of claim 11, wherein applying the current further comprises inducing a magnetic torque that generates a first magnetization in a second magnetic layer in the magnetic tunnel junction adjacent to the first layer in the memory array while a second magnetization exists in a first magnetic layer in the magnetic tunnel junction adjacent to the second layer in the memory array.

13. The method claim 12, wherein applying the voltage further comprises inducing the second magnetization in the first magnetic layer in the memory array.

14. The method of claim 12, wherein a direction of the second magnetization is antiparallel to a direction of the first magnetization.

15. The method of claim 14, wherein the first magnetization is oriented in a first direction towards the second layer and the second magnetization is oriented in a second direction towards the first layer and the first magnetization and the second magnetization are both perpendicular to the second polarity of the current in the first layer.

16. The method of claim 12, wherein the first magnetic layer comprises a FeCoB/Tungsten/Cobalt/Iridium/Cobalt.

17. The method of claim 12, wherein the second magnetic layer comprises FeCoB, Co, Iridium.

18. The method of claim 11, further comprising applying the bias voltage to one or more other rows in the second layer to ensure the one or more other memory elements in the memory array are not programmed.

19. The method of claim 11, wherein applying the voltage and applying the current occurs substantially simultaneously.

20. The method of claim 11, wherein applying the bias voltage to the one or more other columns in the first layer of the memory array ensures one or more other memory elements in the memory array are not programmed.

21. A method for reading a memory element in a memory array, wherein the memory array comprises a first layer with a plurality of columns, a second layer with a plurality of rows, and a magnetic tunnel junction adjacent to each of the first layer and the second layer, the method comprising:

applying a first voltage with a first amplitude, a first polarity, and a first duration to a column in the first layer in the memory array to read the memory element;

applying a second voltage to a row in the second layer in the memory array to read the memory element; and determining a resistance of the memory element that corresponds to the column in the first layer and the row in the second layer by identifying a current value in the column of the first layer.

22. The method of claim 21, wherein the first layer comprises a plurality of thin film layers.

23. The method of claim 21, wherein the second layer comprises a conductive metal layer of multiple metal layers.

24. A system, comprising:
a first layer to conduct voltage;
a second layer to conduct current, wherein the second layer is rotated about a plane of 90 degrees with respect to the first layer;
a reference layer with a first perpendicular magnetic anisotropy adjacent to a surface of the first layer, wherein the reference layer comprises an amorphous phase layer;
a tunnel barrier adjacent to a surface of the reference layer; and
a free layer with a second perpendicular magnetic anisotropy adjacent to a surface of the tunnel barrier and a surface of the second layer.

* * * * *